(12) United States Patent
Kim

(10) Patent No.: US 9,711,197 B1
(45) Date of Patent: Jul. 18, 2017

(54) MEMORY DEVICE AND OPERATING METHOD THEREOF

(71) Applicant: SK hynix Inc., Gyeonggi-do (KR)

(72) Inventor: Jae Woong Kim, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/239,726

(22) Filed: Aug. 17, 2016

(30) Foreign Application Priority Data

Mar. 21, 2016 (KR) ........................ 10-2016-0033580

(51) Int. Cl.
| | |
|---|---|
| *G11C 7/12* | (2006.01) |
| *G11C 7/22* | (2006.01) |
| *G06F 1/26* | (2006.01) |
| *G11C 7/10* | (2006.01) |

(52) U.S. Cl.
CPC ............... *G11C 7/22* (2013.01); *G06F 1/266* (2013.01); *G11C 7/10* (2013.01); *G11C 7/12* (2013.01)

(58) Field of Classification Search
CPC .................................. G11C 7/12; G11C 16/26

USPC ..................................... 365/189.05, 203, 223
See application file for complete search history.

(56) References Cited

U.S. PATENT DOCUMENTS

| | | | |
|---|---|---|---|
| 7,068,539 B2* | 6/2006 | Guterman | G11C 11/5628 365/185.18 |
| 8,711,616 B2* | 4/2014 | Sarin | G11C 11/5628 365/185.03 |
| 9,082,515 B2* | 7/2015 | Tomotani | G11C 29/832 |
| 9,336,881 B2* | 5/2016 | Shimakawa | G11C 13/0069 |

FOREIGN PATENT DOCUMENTS

| | | |
|---|---|---|
| KR | 100816220 | 3/2008 |
| KR | 1020150029405 | 3/2015 |

\* cited by examiner

*Primary Examiner* — Michael Tran
(74) *Attorney, Agent, or Firm* — IP & T Group LLP

(57) ABSTRACT

Provided herein is a memory device including a plurality of memory blocks comprising a plurality of memory blocks each comprising a plurality of memory cells; a peripheral circuit coupled to the memory cells through bit lines, and suitable for sensing currents of the bit lines varying according to threshold voltages of the memory cells; and a control logic suitable for controlling the peripheral circuit so that the current amount of the bit lines vary during a program operation of the memory cells.

15 Claims, 8 Drawing Sheets

MEMORY DEVICE AND OPERATING METHOD THEREOF

CROSS-REFERENCE TO RELATED APPLICATION

The present application claims priority under 35 U.S.C. §119(a) to Korean patent application number 10-2016-0033580 filed on Mar. 21, 2016, which is incorporated herein in its entirety by reference.

BACKGROUND

1. Field

Various embodiments of the present disclosure relate to a memory device and an operating method thereof and, more particularly, to a memory device and a program method thereof.

2. Description of Related Art

A storage device may include a memory device in which data is stored and a memory controller which controls the memory device.

The memory device may include a nonvolatile memory device or a volatile memory device. A nonvolatile memory device maintains stored data even when the power supply to the device is turned off. In a volatile memory stored data are erased when power supply to the device is stopped.

Between the two types of memory devices, a nonvolatile memory device consumes less power, can be more readily miniaturized and has larger storage capacity. Accordingly a nonvolatile memory device is primarily employed as a storage device of a mobile electronic device.

A nonvolatile memory device may include a memory cell array in which data is stored, a peripheral circuit configured to program, read, or erase memory cells included in the memory cell array, and a control logic for controlling the peripheral circuit.

The control logic may control the peripheral circuit so that a program, read, or erase operation is performed according to a command provided by a host. For example, in a program operation an address, and data corresponding to the read command may also be provided by the host.

The memory cell array may include a plurality of memory blocks. Each memory block may include a plurality of strings coupled between bit lines and source lines. Each of the strings may include a plurality of memory cells. As the number of strings included in each block increases, the electrical characteristics of the source lines to which the plurality of strings are coupled in common may be degraded and accordingly reliability of the memory device may be lowered.

SUMMARY

Various embodiments of the present disclosure are directed to a memory device capable of performing a program operation with improved reliability and an operating method thereof.

One embodiment of the present disclosure provides a memory device including: a plurality of memory blocks each comprising a plurality of memory cells; a peripheral circuit coupled to the memory cells through bit lines, and suitable for sensing currents of the bit lines varying according to threshold voltages of the memory cells; and a control logic suitable for controlling the peripheral circuit so that the current amount of the bit lines vary during a program operation of the memory cells.

Another embodiment of the present disclosure provides an operating method of a memory device. The operating method includes: increasing threshold voltages of selected memory cells; pre-charging bit lines coupled to the selected memory cells; and sensing currents of the bit lines varying according to the threshold voltages of the memory cells after a strobe time upon completion of the pre-charging, wherein the increasing, the pre-charging and the sensing are repeated until the threshold voltages of the selected memory cells reach a target voltage while the strobe time is gradually decreased.

Still another embodiment of the present disclosure provides an operating method of a memory device. The operating method includes: performing first to Nth program loops each including sensing selected memory cells for a first strobe time; and performing, after the Nth program loop, program loops each including sensing the memory cells for a second strobe time shorter than the first strobe time until threshold voltages of the selected memory cells reach a target voltage.

BRIEF DESCRIPTION OF THE DRAWINGS

Example embodiments will now be described more fully hereinafter with reference to the accompanying drawings wherein.

DETAILED DESCRIPTION

Figure 1:
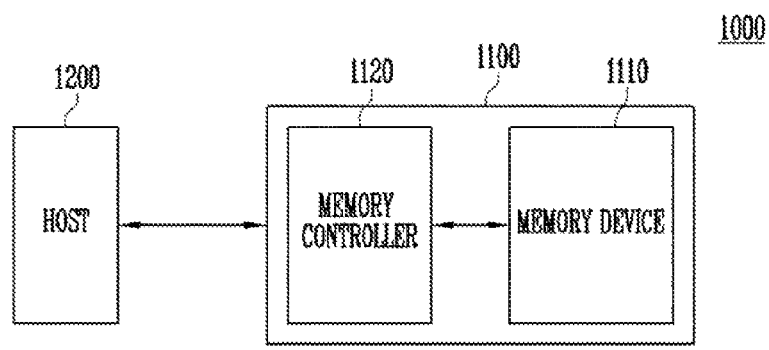
FIG. 1 illustrates a memory system, according to an embodiment of the present disclosure.

Hereinafter, embodiments of the present disclosure will be described with reference to the attached drawings. In the following description, only parts which are required for understanding the present disclosure will be described whereas explanation of other parts will be omitted for not obscuring the present disclosure. Accordingly, it is noted that the present invention may be embodied in different forms and should not be construed as being limited to the embodiments set forth herein. Rather, these embodiments are provided so that the disclosure of the present invention will be thorough and complete to those skilled in the art to which this invention pertains.

In the drawings, dimensions may be exaggerated for clarity of illustration. Also, it will be understood that when an element is referred to as being "between" two elements, it can be the only element between the two elements, or one or more intervening elements may also be present. Like reference numerals refer to like elements throughout.

It will be also understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described of in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Referring now to FIG. 1 a memory system 1000 is provided, according to an embodiment of the present disclosure.

The memory system 1000 may be configured with a storage device 1100 and a host 1200 for controlling the storage device 1100. The storage device 1100 may include a memory device 1110 configured to store data, and a memory controller 1120 for controlling the memory device 1110.

The host 1200 may communicate with the storage device 1100 through an interface protocol, such as, for example, a Peripheral Component Interconnect-Express (PCI-E), an Advanced Technology Attachment (ATA), a Serial ATA (SATA), a Parallel ATA (PATA), a Serial Attached SCSI (SAS), a Universal Serial Bus (USB), a Multi-Media Card (MMC), an Enhanced Small Disk Interface (ESDI), an Integrated Drive Electronics (IDE), and the like.

The memory controller 1120 controls an operation of the storage device 1100 and data exchange between the host 1200 and the memory device 1110. For example, the memory controller 1120 may control the memory device 1110 so that a program, read, or erase operation is performed according to a request from the host 1200.

The memory device 1110 may include, for example, a Double Data Rate Synchronous Dynamic Random Access Memory (DDR SDRAM), a Low Power Double Data Rate4 (LPDDR4) SDRAM, a Graphics Double Data Rate (GDDR) SDRAM, Low Power DDR (LPDDR), a Rambus Dynamic Random Access Memory (RDRAM), or a FLASH Memory. In an embodiment, the memory device 1110 is configured with one or more flash memories.

Figure 2:
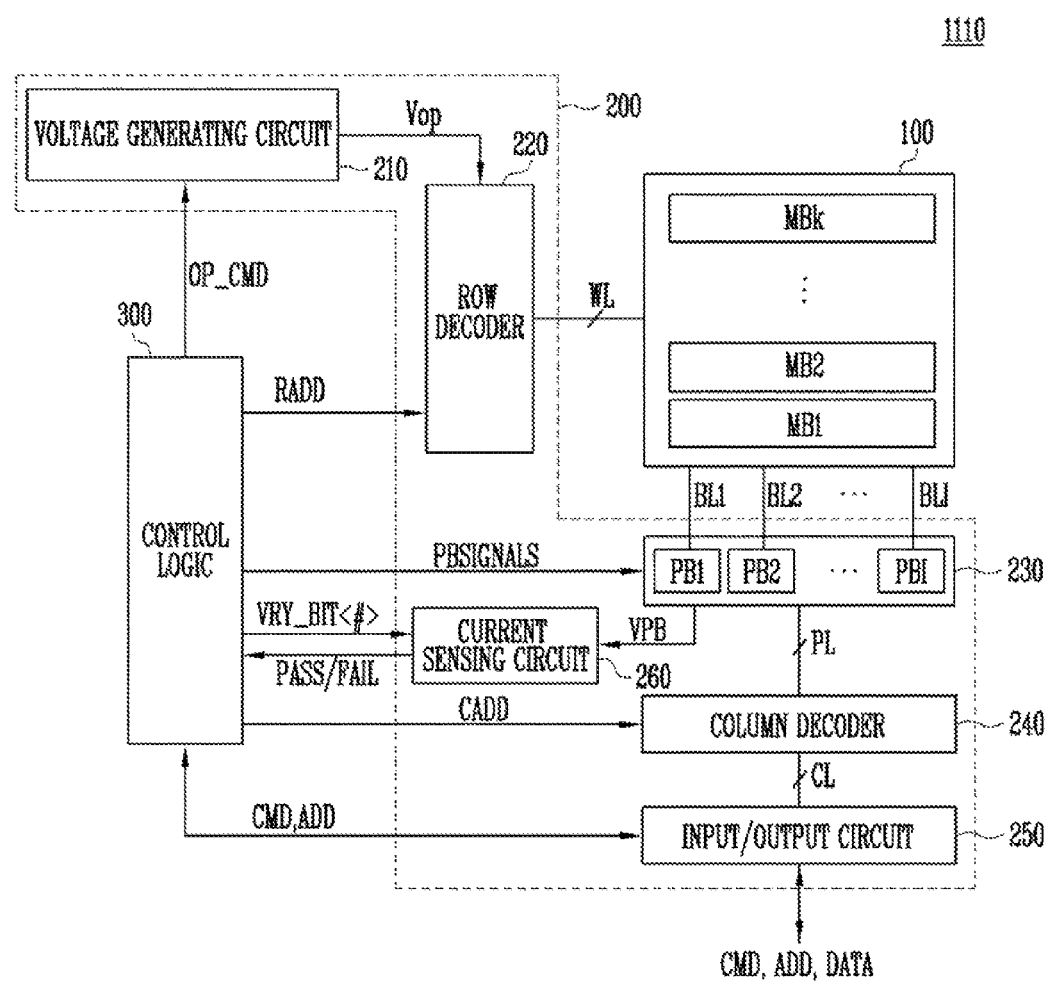
FIG. 2 is a schematic diagram of an example configuration of a memory device of FIG. 1, according to an embodiment of the present disclosure.

FIG. 2 illustrates a configuration of the memory device of FIG. 1, according to an embodiment of the present disclosure.

Referring to FIG. 2, the memory device 1110 may include a memory cell array 100 for storing data; a peripheral circuit 200 configured to perform at least one of a program operation for storing data in the memory cell array 100, a read operation for outputting the stored data, and an erase operation for erasing the stored data; and a control logic 300 for controlling the peripheral circuit 200.

The memory cell array 100 may include a plurality of memory blocks MB1 to MBk, where k is a positive integer. To each of the memory blocks MB1 to MBk, word lines WL and bit lines BL1 to BLl, where l is a positive integer, may be coupled. The word lines WL may be respectively coupled to the memory blocks. The bit lines BL1 to BLl may be coupled in common to the memory blocks. Although not illustrated in FIG. 2, besides the word lines WL, source select lines, drain select lines, or pipe lines may be coupled to the memory blocks MB1 to MBk according to a configuration which will be described in more detail below.

The peripheral circuit 200 may include a voltage generating circuit 210, a row decoder 220, a page buffer unit 230, a column decoder 240, an input/output circuit 250, and a current sensing circuit 260.

The voltage generating circuit 210 may generate various operating voltages Vop which may be used for a program, read, or erase operation in response to an operation signal OP_CMD, as may be needed. For example, the voltage generating circuit 210 may generate a program voltage, a read voltage, an erase voltage, a pass voltage, and a turn-on voltage.

The row decoder 220 may transmit the operating voltages Vop to a word line WL which is coupled to a selected memory block in response to a row address RADD. Although not illustrated in FIG. 2, the row decoder 220 may also transmit the operating voltage Vop to a source select line, a drain select line, or a pipe line in response to the row address RADD.

The page buffer unit 230 may include a plurality of page buffers PB1 to PBl each buffer being coupled to a corresponding bit line among the plurality of bit lines BL1 to BLl. The page buffers PB1 to PBl may operate in response to page buffer control signals PBSIGNALS received from the control logic 300. For example, the page buffers PB1 to PBl may temporarily store data received through their respective bit lines BL1 to BLl or sense voltages or currents of their respective bit lines BL1 to BLl during a read or verify operation. The verify operation may include verify operations performed during a program operation and an erase operation.

The column decoder 240 may transmit data between the input/output circuit 250 and the page buffer unit 230 in response to a column address CADD received from the control logic 300. For example, the column decoder 240 may exchange data with the page buffers PB through page lines PL or with the input/output circuit 250 through column lines CL.

The input/output circuit 250 may transmit a command CMD and/or an address ADD provided from the memory controller 1120 (of FIG. 1) to the control logic 300. The input/output circuit 250 may transmit and/or receive data DATA with the column decoder 240.

During a read or verify operation, the current sensing circuit 260 may generate a reference current according to an enable bit VRY_BIT<#> received from the control logic 300, and may compare a sensing voltage VPB provided from the page buffer unit 230 with a reference current (not shown) for generating a pass signal PASS or a fail signal FAIL and transmitting said pass or fail signal PASS, FAIL to the control logic 300.

The control logic 300 may output an operation signal OP_CMD, a row address RADD, the page buffer control signals PBSIGNALS, and the enable bit VRY_BIT<#> in response to the command CMD and the address ADD to control the peripheral circuit 200. In addition, the control logic 300 may determine whether a verify operation passed or failed in response to the pass or fail signal PASS or FAIL provided from the current sensing circuit 260. In particular, for improving reliability of a program operation, the control logic 300 may adjust the page buffer control signals PBSIGNALS or the enable bit VRY_BIT <#> to control the peripheral circuit 200. A detailed method for adjusting the page buffer control signals PBSIGNALS or the enable bit VRY_BIT<#> will be described later.

Figure 3:
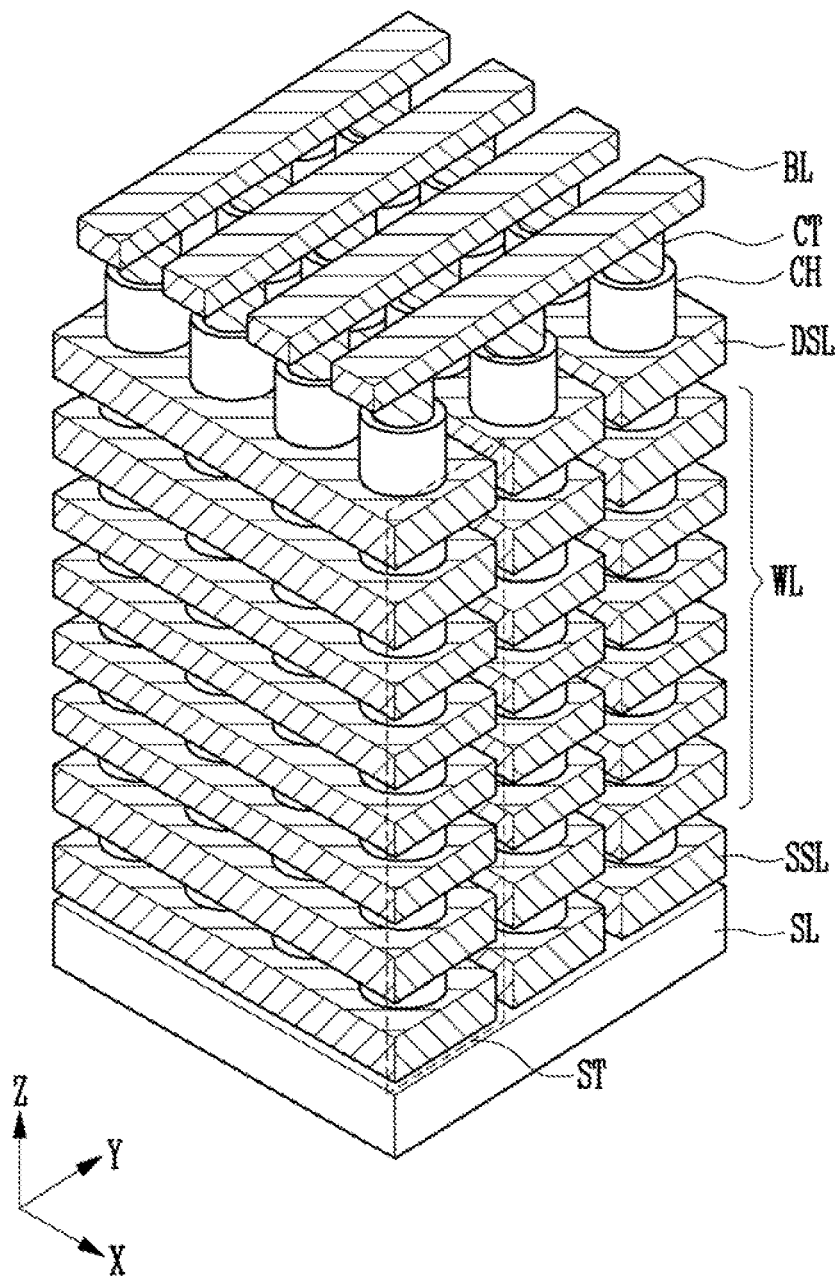
FIG. 3 is a perspective view of a three-dimensional memory block, according to an embodiment of the present disclosure.

FIG. 3 illustrates a 3-dimensional memory block, according to an embodiment.

Referring to FIG. 3, a memory block realized in a 3-dimensional structure may be formed in a letter I shape, which protrudes in a perpendicular direction (i.e. Z direction) to a substrate and may include strings ST arranged between the bit lines BL and the source lines SL. Such structure is referred to as Bit Cost Scalable (BiCS). For example, when the source lines SL are formed horizontally on the substrate, the strings ST having the BiCS structure may be formed vertically on the source lines SL. Each of the strings ST may include a source select line SSL, a plurality of word lines WL, and a drain select line DSL. A plurality of strings ST (three strings are shown in FIG. 3) are arranged along a first direction (i.e., a Y direction) and separated from each other to be laminated. The numbers of the source select lines SSL, word lines WL, and drain select lines DSL are not limited to those illustrated in FIG. 3, and may vary. Each of the strings ST may include vertical channel layers CH for vertically penetrating the source select lines SSL, the word lines WL, and the drain select lines DSL, and bit lines BL for abutting onto top parts of the vertical channel layers, which protrude from top parts of the drain select lines, and arrayed in a second direction (i.e. X direction) intersecting with the first direction (i.e. Y direction). The memory cells may be formed between the word lines WL and the vertical channel layers CH. A contact plug CT may be further formed between the bit lines BL and the vertical channel layers CH.

Figure 4:
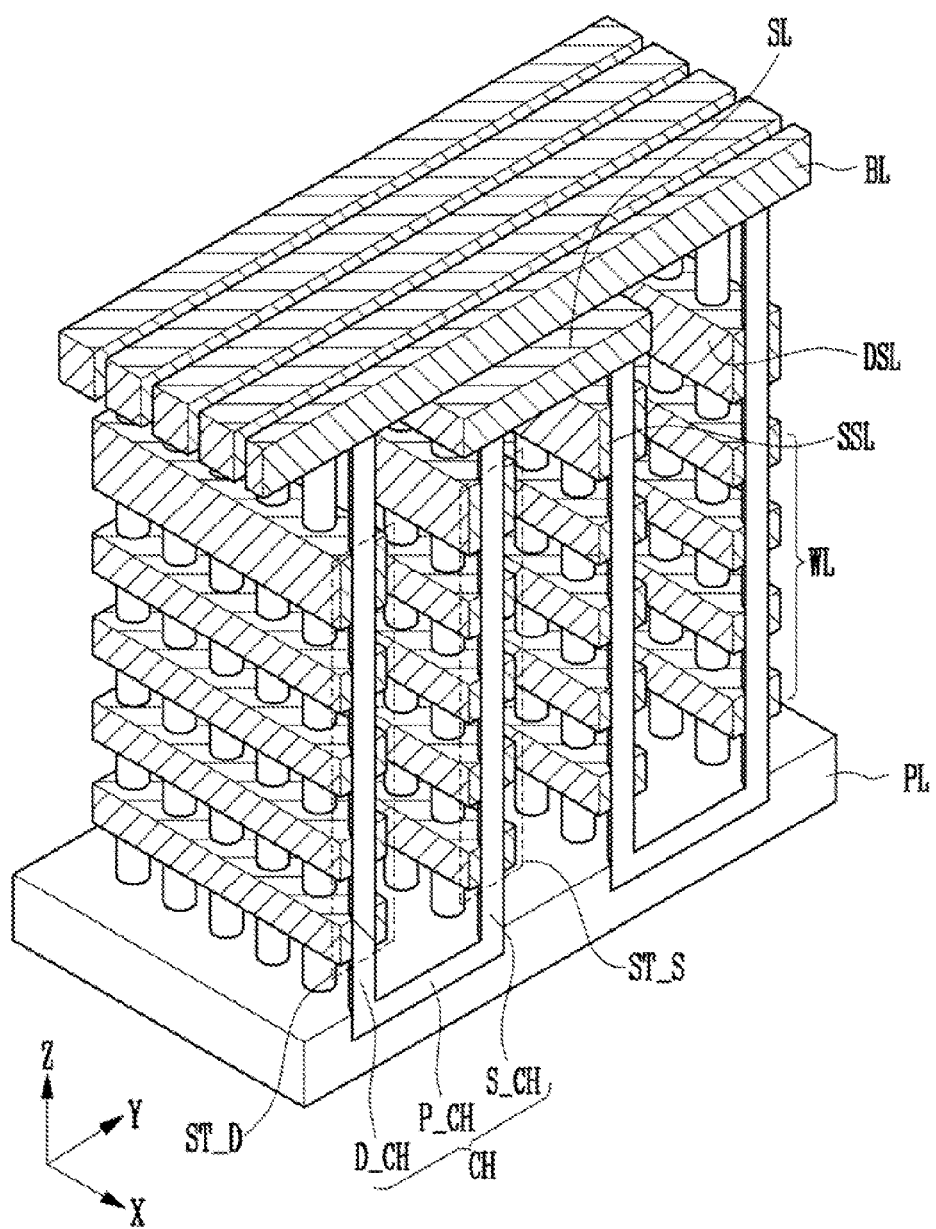
FIG. 4 is a perspective view of a three-dimensional memory block, according to another embodiment of the present disclosure.

FIG. 4 illustrates another 3-dimensional structure for a memory block, according to another embodiment.

Referring to FIG. 4, a memory block realized in a 3-dimensional structure may be formed in a letter U shape, which is perpendicular (i.e., Z-direction) to a substrate and may include source strings ST_S arranged between the bit lines BL and the source lines SL and drain strings ST_D. The source strings ST_S and the drain strings ST_D may be coupled to each other through a pipe channel P_CH to form the U shape. The pipe channel P_CH may be coupled to the pipe line PL. The source strings ST_S may be vertically arranged between the source lines SL and the pipe line PL and the drain stings ST_D may be vertically arranged between the bit lines BL and the pipe line PL. Such a structure is referred to as Pipe-shaped Bit Cost Scalable (P-BiCS).

The drain stings ST_D may include the word lines WL and drain select lines DSL arranged in a first direction (i.e. Y direction) and separated from each other to be laminated, and drain vertical channel layers D_CH vertically penetrating the word lines WL and the drain select lines DSL. The source strings ST_S may include the word lines WL arranged in the first direction (i.e. Y direction) and separated from each other to be laminated and source select lines SSL, and source vertical channel layers S_CH vertically penetrating the word lines WL and the source select lines SSL. The drain vertical channel layers D_CH and the source vertical channel layers S_CH may be coupled to each other by the pipe channel layers P_CH on the pipe line PL. The bit lines BL may abut onto top parts of the drain vertical channel layers D_CH protruding from top parts of the drain select lines DSL and be arranged in a second direction (i.e., X direction) perpendicular to the first direction (i.e., Y direction).

As shown in FIGS. 3 and 4, the plurality of strings are coupled in common to the source line SL and a high voltage may be temporarily generated during read and verify operations. This phenomenon is referred to as source bouncing. When source bouncing occurs, threshold voltages of memory cells may be sensed as being higher than they actually are during a sensing operation. Due to this erroneous threshold voltage sensing, memory cells are programmed to have lower threshold voltages than a target voltage during a program operation. This is, known as an under-program.

An under-program will now be described in more detail with reference to FIG. 5.

Figure 5:
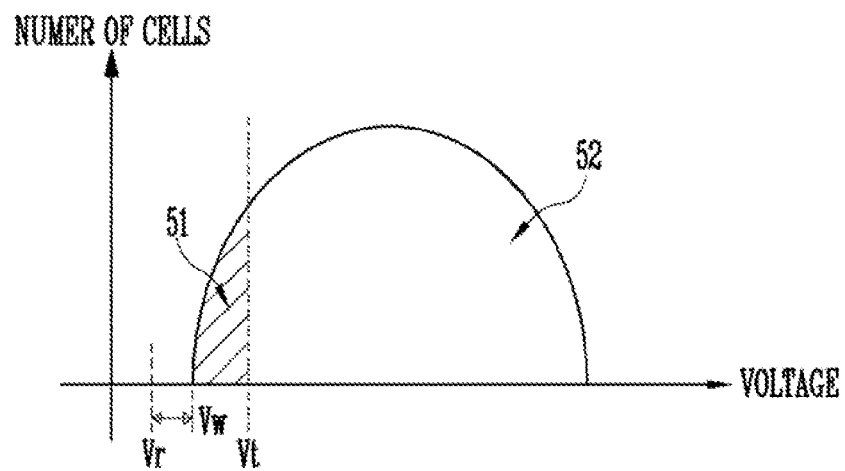
FIG. 5 is a graph illustrating an under-program.

Referring to FIG. 5, a program operation may be performed in an incremental step pulse program (ISPP) manner in which a program voltage is increased step by step. The program operation may include a threshold voltage increase operation for increasing the threshold voltages of the memory cells and a verify operation for determining whether the threshold voltages of the memory cells reach the target voltage Vt.

During the verify operation, voltages of bit lines, which change according to the threshold voltages of the memory cells, are sensed. When the source bouncing occurs during the verify operation, the threshold values of the memory cells may be sensed as higher than the actual threshold voltages. In this case, the verify operation may pass even though the actual threshold voltages of the under-programmed memory cells are lower than the target voltage Vt. In the example shown in FIG. 5, the memory cells 51 having threshold voltages lower than the target voltage Vt are under-programmed memory cells and the memory cells 52 having threshold voltages higher than the target voltage Vt are normally programmed memory cells.

Such an under-program may mainly occur in fast cells rather than in slow cells. Here, fast cells are memory cells having a relatively faster program speed than slow cells. In particular, at an early stage of a program operation, current flowing from the slow cells to the source lines may surge, and at this point, the threshold voltages of the fast cells may be sensed as being higher than their actual threshold voltages. When the threshold voltages of the fast cells are sensed as higher than the actual voltages, the program operation to the fast cells may be determined as successfully completed even though the threshold voltages do not reach the target voltage, and thus the fast cells may be under-programmed.

In this way, when under-programmed memory cells exist, wrong data may be outputted and errors may occur during the read operation. For example, although a read voltage Vr is set to be lower than the target voltage Vt, the threshold voltages of the under-programmed memory cells 51 are lower than the target voltage Vt and thus a margin Vw to the read voltage Vr may not be sufficient. Accordingly, when a retention characteristic or the like is degraded, reliability of the under-programmed memory cells may be further degraded.

In order to prevent reliability of the memory device from being degraded because of an under-program, an amount of current may be adjusted during the program operation, according to an embodiment of the present disclosure.

Figure 6:
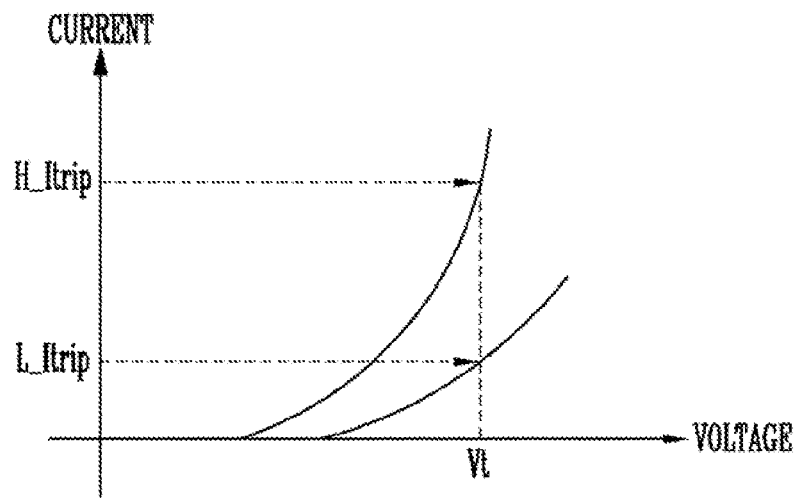
FIG. 6 is a graph explaining an I-V curve.

FIG. 6 is a graph for explaining an I-V curve.

Referring to FIG. 6, when a test program operation is performed which raises the threshold voltages of the memory cells to the target voltage Vt through a first current amount L-Itrip and a second current amount H-Itrip, which are different from each other, it may be observed that a difference occurs in an amount of charges stored in the memory cells. Here, the first and second current amounts L_Itrip and H_Itrip may be currents flowing through the bit lines during the verify operation.

When it is assumed that the second current amount H_Itrip is greater than the first current amount L_Itrip, the threshold voltages of the memory cells may reach the target voltage Vt faster with the first current amount L_Itrip than with the second current amount H_Itrip.

In other words, as the current amount of the bit lines is lowered from the second current amount H_Itrip to the first current amount L_Itrip during the verify operation in the program operation, charges stored in the memory cells increase per unit time. A greater amount of charges stored in the memory cells means a faster increase of the threshold voltages of the memory cells. Accordingly, when the verify operation is performed with a low current, the under-program of the memory cells may be prevented.

In order to adjust the current amount during the verify operation, the control logic 300 may adjust the page buffer control signals PBSIGNALS to change a strobe time of the page buffers PB1 to PBI as will be described in more detail with reference to FIG. 7.

Figure 7:
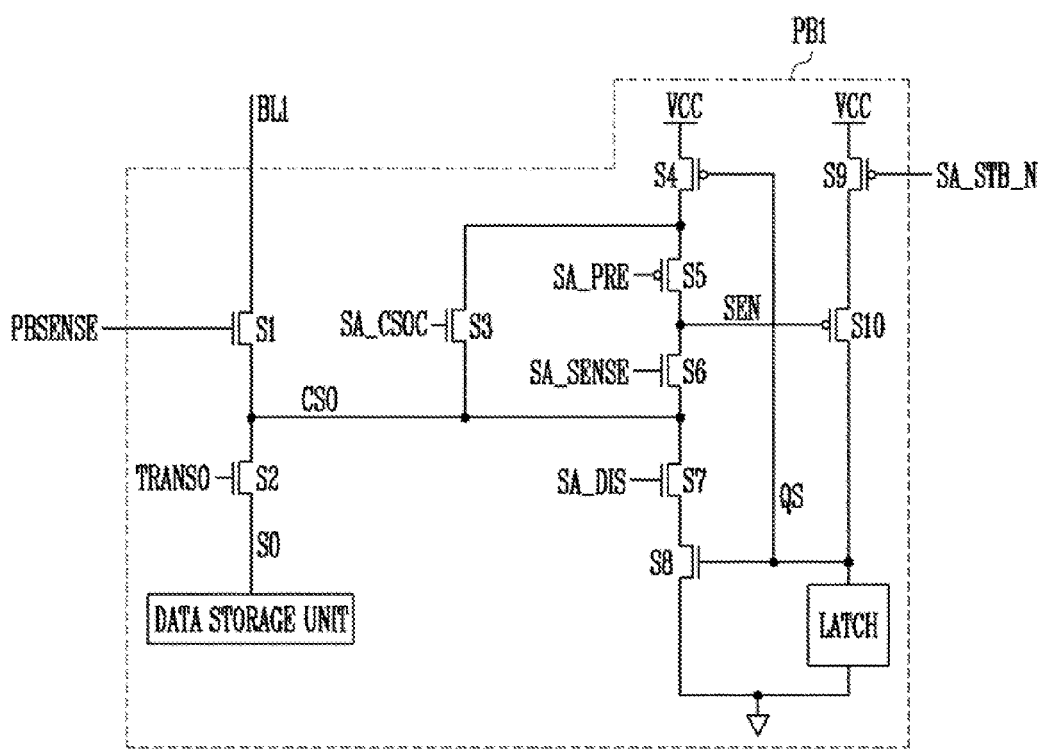
FIG. 7 illustrates a configuration of a page buffer of FIG. 2, according to an embodiment of the present disclosure.

FIG. 7 illustrates an example configuration of the page buffer of FIG. 2.

We note that the first to $I_{th}$ page buffers PB1 to PSI illustrated in FIG. 2 may be configured identically to each other according to the configuration of FIG. 7.

Referring to FIG. 7, the first page buffer PB1 coupled to the first bit line BL1 may include a first to a tenth switches S1 to S10. Signals PBSENSE, TRANSO, SA_CSOC, SA_PRE, SA_SENSE, SE_DIS, and SA_STB_N for controlling the first to tenth switches S1 to S10 may be included in the page buffer control signals PBSIGNALS of FIG. 2.

The first switch S1 may be realized with an NMOS transistor for coupling the bit line BL1 and a first current sensing node CSO to each other in response to a sensing signal PBSENSE. The second switch S2 may be realized with an NMOS transistor for coupling the first current sensing node CSO and a sensing node SO to each other in response to a transmission signal TRANSO. The sensing node SO may be coupled to a data storage unit, and may be coupled to the current sensing circuit 260 of FIG. 2 during the sensing operation. During the sensing operation, a voltage applied to the sensing node SO may be transmitted to the current sensing circuit 260 as the sensing voltage VPB of FIG. 2. For example, during the sensing operation, the sensing nodes SO of the first to $I_{th}$ page buffers PB1 to PBI are coupled in common to the current sensing circuit 260, and at this point, a voltage transmitted from the first to $I_{th}$ page buffers PB1 to PBI to the current sensing circuit 260 may be the sensing voltage VPB.

The third switch S3 may be realized with a NMOS transistor for coupling the first current sensing node CSO and a node between the fourth and fifth switches S4 and S5 to each other in response to a pre-charge transmission signal SA_CSOC.

The fourth switch S4 may be realized with a PMOS transistor for coupling a power supply terminal VCC and the fifth switch S5 according to a potential at a data node QS. The data node QS may be varied according to data stored in a latch LATCH and may be initialized in a low level. The fifth switch S5 may be realized with a PMOS transistor for transmitting the power supply voltage provided through the fourth switch S4 to a second current sensing node SEN in response to a pre-charge signal SA_PRE. The sixth switch S6 may be realized with an NMOS transistor for coupling the second current sensing node SEN and the first current sensing node CSO to each other in response to a sensing delivery signal SA_SENSE. The seventh switch S7 may be realized with an NMOS transistor coupling the first current sensing node CSO and the eighth switch S8 to each other in response to a discharge signal SA_DIS. The eighth switch S8 may be realized with an NMOS transistor for coupling the seventh switch S7 and a ground terminal in response to a potential of a data node QS coupled to the latch LATCH.

The ninth switch S9 may be realized with a PMOS transistor for coupling a power supply terminal VCC and the tenth switch S10 according to a strobe signal SA_STB_N. The tenth switch S10 may be realized with a PMOS transistor for forming a current path between the ninth switch S9 and the latch LATCH in response to a potential of the second current sensing node SEN.

An operation of the first page buffer PB1 will be described as the following.

Before the sensing operation of the first page buffer PB1, a pre-charge operation may be performed for pre-charging the first bit line BL1 to a positive voltage. During the pre-charge operation, data '0' may be stored in the latch LATCH. Data '0' may initialize the data node QS at a low level. When the potential of the data node QS is low, the fourth switch S4 may be turned on. When the third and first switches S3 and S1 are turned on in response to the pre-charge transmission signal SA_CSOC and the sensing signal PBSENSE, a current path may be formed through the fourth, third, and first switches S4, S3, and S1. Accordingly, the first bit line BL1 and the power supply terminal VCC are electrically coupled to each other and the first bit line BL1 may be pre-charged to a positive voltage. We note, that pre-charging of the first bit line BL1 may also be performed in various methods other than the above-described method.

When the first bit line BL1 is pre-charged, the third and fifth switches S3 and S5 are turned off in response to the pre-charge transmission signal SA_CSOC and the pre-charge signal SA_PRE, and accordingly, supplying the pre-charge voltage to the first current sensing node CSO may be stopped. Subsequently, when a verify voltage is applied to a selected word line, a potential of the first bit line BL1 may be maintained to a pre-charge level or may be lowered according to a threshold voltage of a memory cell coupled to the selected word line.

Then, a sensing operation may be performed for sensing the potential of the first bit line BL1. During the sensing operation, the first and sixth switches S1 and S6 are turned on and thus the tenth switch S10 may be turned on or off according to the potential of the first current sensing node CSO. Subsequently, when the ninth switch S9 is turned on according to the strobe signal SA_STB_N, the data QS stored in the latch LATCH may be kept as is or may be changed according to whether the tenth switch S10 is turned on or off. Here, a time duration from when the fifth switch S5 is turned off to when the ninth switch S9 is turned on is referred to as a strobe time in this disclosure, and the strobe time may be adjusted to change an amount of current used for the verify operation.

A method for adjusting the strobe time will be described as the following.

Figure 8:
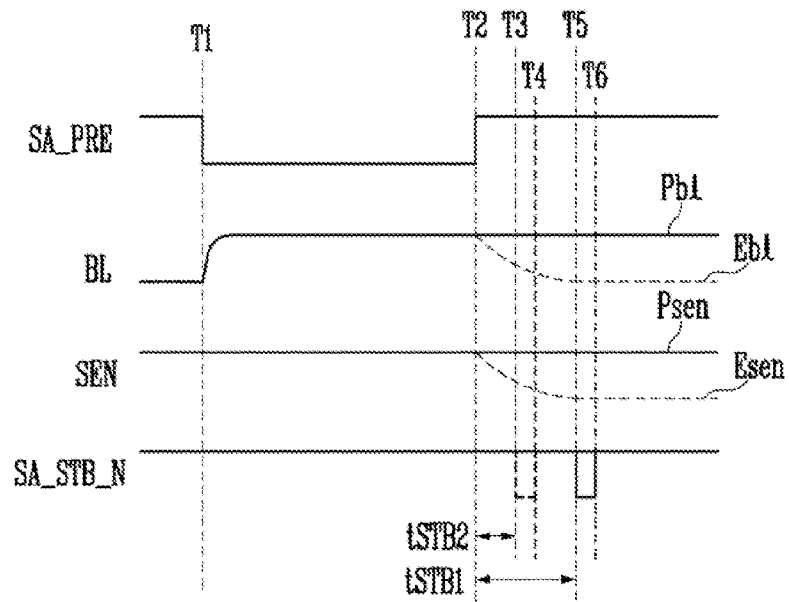
FIG. 8 is a timing diagram for explaining a method for adjusting a strobe time.

FIG. 8 is a timing diagram for explaining a method for adjusting a strobe time.

Referring to FIGS. 7 and 8, when the verify operation starts at time point T1 during the program operation, the pre-charge signal SA_PRE may be transitioned from a high level to a low level for pre-charging the bit line BL. When the pre-charge signal SA_PRE is low, the bit line BL is pre-charged as described in relation to FIG. 7.

When the bit line BL is pre-charged, the pre-charge signal SA_PRE is transitioned from low to high at time point T2 and the sensing operation is performed. The sensing operation may be performed by applying a verify voltage to a selected word line. When the verify voltage is applied to the selected word line, the potential of the bit line BL may be lowered or kept as it is according to the threshold voltage of the memory cells coupled to the selected word line. During the sensing operation, since the first and sixth switches S1 and S6 are turned on, the potential of the second current sensing node SEN may be lowered or kept as it is according to the potential of the bit line BL. For example, the potentials of the bit lines coupled to the memory cells, of which threshold voltages reach the target voltage, and the potential of the second current sensing node SEN may be maintained as is (denoted as "Pb1" and "Psen" in FIG. 8) while potentials of the bit lines BL coupled to memory cells, of which the threshold voltages are lower than the target voltage, and the potential of the second current sensing node SEN may be lowered (denoted as "Eb1" and "Esen" in FIG. 8).

Then, the strobe signal SA_STB_N is toggled to a low level and keeps it for time points T3 and T4 or T5 and T6. During the low level of the strobe signal SA_STB_N, a sensed data may be provided to the latch LATCH of FIG. 7 through the bit line BL and the second current sensing node SEN. At this point, a time duration from time point T2 when the pre-charge signal SA_Pre is transitioned to high to time point T3 or T5 when the strobe signal SA_STB_N is toggled to low may be defined as the strobe time tSTB. FIG. 8 shows two exemplary cases of a relatively long first strobe time tSTB1 (i.e., the strobe time tSTB from time point T2 to time point T5) and a relatively short second strobe time tSTB2 (i.e., the strobe time tSTB from time point T2 to time point T3).

The current amount Itrip of the sensing operation is inversely proportional to the strobe time tSTB. This will be described with reference to the following Equation 1.

$$Itrip = \frac{(Csen + Ccso) \times \Delta Vtrip}{tSTB} \quad \text{[Equation 1]}$$

In Equation 1, Itrip denotes the current amount of the sensing operation, Csen denotes a capacitance value of the second current sensing node SEN, and Ccso denotes a capacitance value of the first current sensing node CSO. $\Delta$Vtrip denotes factors including threshold voltages, current values, or capacitance values of the data node QS, of the switches S1 to S10 forming the page buffer. Also, tSTB denotes a strobe time. When Csen, Ccso, and $\Delta$Vtrip are assumed to be constant, it may be seen that the current amount Itrip is inversely proportional to the strobe time tSTB.

At this point, it may be seen from Equation 1 that the current amount Itrip is less during a sensing operation with the relatively long first strobe time tSTB1 than during a sensing operation with the relatively short second strobe time tSTB2. In other words, during the sensing operation, the threshold voltages of the memory cells may be programmed faster when the first strobe time tSTB1 is applied than when the second strobe time tSTB2 is applied.

The above-described sensing operation may prevent the under-program of the fast cells. However, since a threshold voltage distribution of the memory cells widens in a case where the sensing operation with the relatively long strobe time is performed in an entire program operation, the sensing operation with the long strobe time may be performed in a portion of the program operation.

Figure 9:
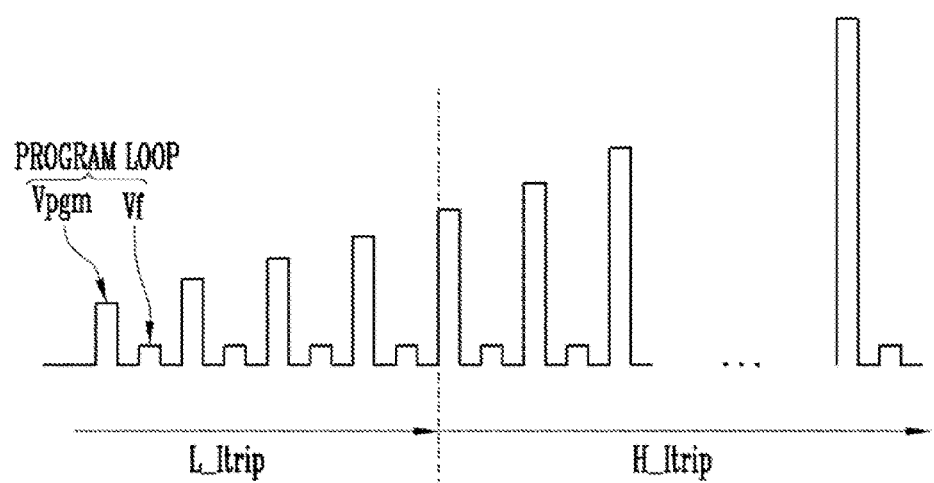
FIG. 9 is a schematic diagram of a program operation, according to an embodiment of the present disclosure.

FIG. 9 illustrates a program operation, according to an embodiment of the present disclosure.

Referring to FIG. 9, the program operation may be performed in an incremental step pulse program (ISPP) manner in which a program voltage is increased step by step. The program operation in an ISPP manner may include program periods during which a program Vpgm is applied to a selected word line to increase the threshold voltages of the memory cells coupled to the selected word line. The program operation in an ISPP manner may also include verify periods during which a verify voltage Vf is applied to the selected word line to determine whether the threshold voltages of the linked memory cells reach a target voltage. A pair of the program period and the verifying period may be defined as a program loop. Accordingly, a plurality of program loops are programmed during the program operation of the ISPP manner. Every time the program loop is performed, a program voltage Vpgm may be increased step by step.

As described above, since the under-program of the fast cells mainly occurs at an early stage of the program operation, the sensing operation with a low current amount L_Itrip is applied to the program loops performed at the early stage of the program operation and as the number of times of program loops increases, the sensing operation with a high current amount H_Itrip may be applied.

For example, the sensing operation with the low current amount L_Itrip may be applied to first to $N_{th}$ program loops, where N is a positive integer, and the sensing operation with the high current amount H_Itrip may be applied to program loops after the $N_{th}$ program loop. In order to apply the sensing operation with the low current amount L_Itrip to the first to $N_{th}$ program loops, the first strobe time tSTB1 may be applied to the sensing operation performed in the verify operation of the first to $N_{th}$ program loops, as described in FIG. 8. In order to apply the sensing operation with the high current amount H_Itrip after the $N_{th}$ program loop, the second strobe time tSTB2, which is shorter than the first strobe time tSTB1, may be applied to the sensing operation performed in the verify operation after the $N_{th}$ program loop, as described in FIG. 8.

Although the program loops are divided into two groups of low and high current amounts L_Itrip and H_Itrip in the embodiment of FIG. 9, the program loops may be divided into three or more groups of gradually varying current amounts. In this case of three or more groups of gradually varying current amounts, gradually decreasing strobe time with gradually increasing current amounts may be applied to the sensing operation as the operation numbers of the program loops increase.

As described above, the under-program of the fast cells, which may occur in an early stage of the program operation, may be prevented by varying a current amount of the sensing operation in the program operation, and thus reliability of the program operation may be improved. In addition, since a threshold voltage distribution of the memory cells may be prevented from being widened and a margin between the threshold voltage and the read voltage may be sufficiently secured, reliability of the read operation may be improved.

A pass/fail determination operation after the strobe signal and the strobe time are adjusted in the page buffer will now be described.

When the transmission signal TRANSCO and the sensing delivery signal SA_SENSE are enabled, the second and sixth switches S2 and S6 in the page buffer are turned on. When the second and sixth switches S2 and S6 are turned on, a voltage of the second current sensing node SEN is transmitted to the sensing node SO through the first current sensing node CSO. The voltage transmitted to the sensing node SO may correspond to the sensing voltage VPB of FIG. 2.

The current sensing circuit 260 of FIG. 2 may receive the sensing voltage VPB from the first to $I_{th}$ page buffers PB1 to PBI and may output a pass signal PASS or a fail signal FAIL. An example of a current sensing circuit 260 will now be described with reference to FIG. 10.

Figure 10:
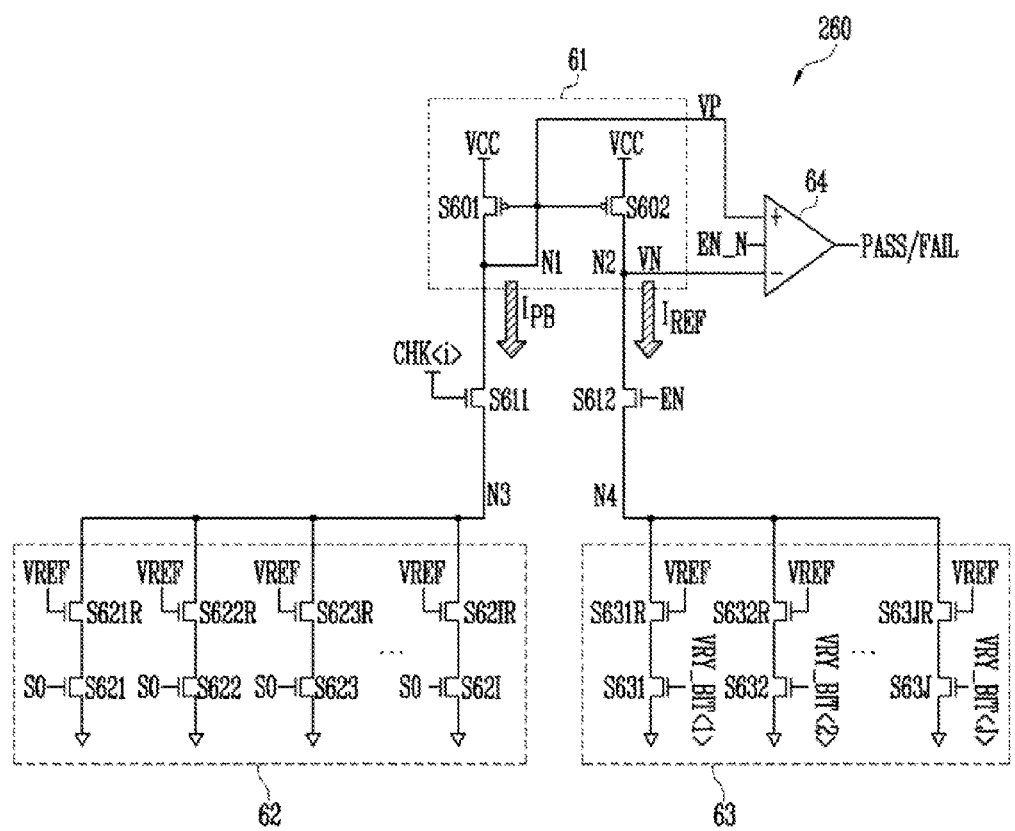
FIG. 10 is a circuit diagram for explaining operation of a current sensing circuit of FIG. 2.

Referring to FIG. 10, the current sensing circuit 260 may output the pass signal PASS when the number of fail bits is equal to or smaller than the number of the enable bits VRY_BIT<#> received from the control logic 300 of FIG. 2, and may transmit the fail signal FAIL when the number of fail bits exceeds the number of the enable bits. The number of fail bits may be determined according to the sensing voltages VPB provided from the first to $I_{th}$ page buffers PB1 to PBI of FIG. 2. For example, as the number of fail cells, of which the respective threshold voltages are lower than a target voltage, increases, the number of fail bits also increases. Accordingly, the number of fail bits may decrease as the number of program loops increases. The number of enable bits VRY_BIT<#> may be maintained constant according to an information set in the control logic 300 of FIG. 2.

The current sensing circuit 260 may include a voltage generating unit 61, a chunk enable switch S611, an enable switch S612, a fail bit counter 62, an enable bit counter 63, and a comparator 64.

The voltage generating unit 61 may generate a pass voltage VP and a fail voltage VN according to a fail bit current IPB and a reference current IREF. For example, the voltage generating unit 61 may generate the fail voltage VN higher than the pass voltage VP when the fail bit current IPB increases, and may generate the pass voltage VP higher than the fail voltage VN when the fail bit current IPB decreases.

To this end, the voltage generating unit 61 may include the first and second switches S601 and S602. The first switch S601 may be a PMOS transistor coupled between a power supply voltage VCC and a first node N1, and may be turned on or off in response to a voltage of the first node N1.

The second switch S602 may be a PMOS transistor coupled between a power supply voltage VCC and a second node N2, and may be turned on or off in response to a voltage of the first node N1. A current flowing through the first node N1 is the fail bit current IPB and a voltage of the first node N1 is the pass voltage VP. A current flowing through the second node N2 is the reference current IREF and a voltage of the second node N2 is the fail voltage VN. Accordingly, when the fail bit current IPB becomes high, the pass voltage VP becomes low, and when the fail bit current IPB becomes low, the pass voltage VP becomes high. In addition, when the reference current IREF becomes high, the fail voltage VN becomes low, and when the reference current IREF becomes low, the fail voltage VN becomes high.

The chuck enable switch S611 may be an NMOS transistor coupled between the first node N1 and the third node N3, and may be turned on or off in response to chuck voltages CHK<i>, which are voltages of internal nodes of the page buffers PB1 to PBI divided in units of chunks.

The enable switch S612 may be an NMOS transistor coupled between the second node N2 and the fourth node N4, and may be turned on or off in response to an enable signal EN for an operation of pass/fail determination.

The fail bit counter 62 may be configured to change a current of the third node N3 according to the sensing voltage VPB of FIG. 2 provided through the sensing nodes SO of the page buffers PB1 to PBI. The fail bit counter 62 may include a plurality of fail bit reference switches S621R to S62IR and a plurality of fail bit switches S621 to S62I. The fail bit reference switches S621R to S61IR are coupled to the third node N3 in parallel. The fail bit switches S621 to S62I are serially coupled to the fail bit reference switches S621R to S61IR, respectively. For example, the first fail bit reference switch S621R and the first fail bit switch S621 may be coupled in series between the third node N3 and the ground terminal. In this way, the $I_{th}$ fail bit reference switch S62IR and the $I_{th}$ fail bit switch S62I may be coupled in series between the third node N3 and the ground terminal. The plurality of fail bit reference switches S621R to S62IR may be NMOS transistors commonly turned on or off in response to the reference voltage VREF. Gates of the plurality of fail bit switches S621 to S62I may be coupled to the sensing nodes SO of the page buffers PB1 to PBI. The sensing voltages VPB of the sensing nodes SO may be high in the fail cells. The plurality of fail bit switches S621 to S62I may be NMOS transistors turned on when a high voltage is applied to gates thereof. Accordingly, as the number of fail cells increases, the number of turned-on fail bit switches S621 to S62I also increases. When the number of turned-on fail bit switches S621 to S62I increases, a current flowing through the third node N3 also increases.

The enable bit counter 63 is configured to maintain a current of the fourth node N4 constant according to the set enable bit VRY_BIT<#>. In other words, the respective enable bits VRY_BIT<#> are fixed in advance and thus the current flowing through the fourth node N4 may also be maintained constant. The respective enable bits VRY_BIT<#> may be set differently according to a memory device in consideration of an error correction code (ECC) performance. The enable bit counter 63 may include a plurality of enable bit reference switches S631R to S63JR and a plurality of enable bit switches S631 to S63J. The enable bit reference switches S631R to S63JR may be coupled to the fourth node N4 in parallel while and the enable bit switches S631 to S63J may be serially coupled to the fail bit reference switches S621R to S61IR, respectively. For example, the first enable bit reference switch S631R and the first enable bit switch S631 may be coupled in series between the fourth node N4 and the ground terminal. Likewise, the Jth fail bit reference switch S62JR and the Jth fail bit switch S62J may be coupled in series between the fourth node N4 and the ground terminal. The plurality of enable bit reference switches S631R to S63JR may be NMOS transistors commonly turned on or off in response to the reference voltage VREF. The plurality of enable bit switches S631 to S63J may be NMOS transistors respectively turned on or off in response to enable bits VRY_BIT<J:1> output from the control logic 300. Accordingly, as the enabled number of enable bits VRY_BIT<J:1> increases, the number of turned-on enable bit switches S631 to S63J also increases. When the number of turned-on enable bit switches S631 to S63J increases, a current flowing through the fourth node N4 also increases.

As described above, while the current of the fourth node N4 is maintained constant according to the enable bits VRY_BIT<J:1>, the current of the third node N3 varies according to the fail cells of each program loop. Accordingly, when both the chunk enable switch S611 and the enable switch S612 are turned on, the fail bit current IPB and the pass voltage VP are generated according to the current of the third node N3 and the reference current IREF and the fail voltage VN are generated according to the current of the fourth node N4.

The comparator 64 compares the pass voltage VP and the fail voltage VN in response to the enable reverse signal EN_N, and outputs a pass signal PASS or a fail signal FAIL according to the comparison result. For example, the pass voltage VP may be applied to a positive terminal of the comparator 64 and a fail voltage VN may be applied to a negative terminal thereof. Accordingly, the comparator 64 outputs a pass signal PASS when the fail voltage VN is higher than the pass voltage VP, and outputs a fail signal FAIL when the pass voltage VP is higher than the fail voltage VN. The control logic 300 may receive the pass signal PASS or the fail signal FAIL and may control the peripheral circuit 200 of FIG. 2 to allow subsequent operations to be performed.

Figure 11:
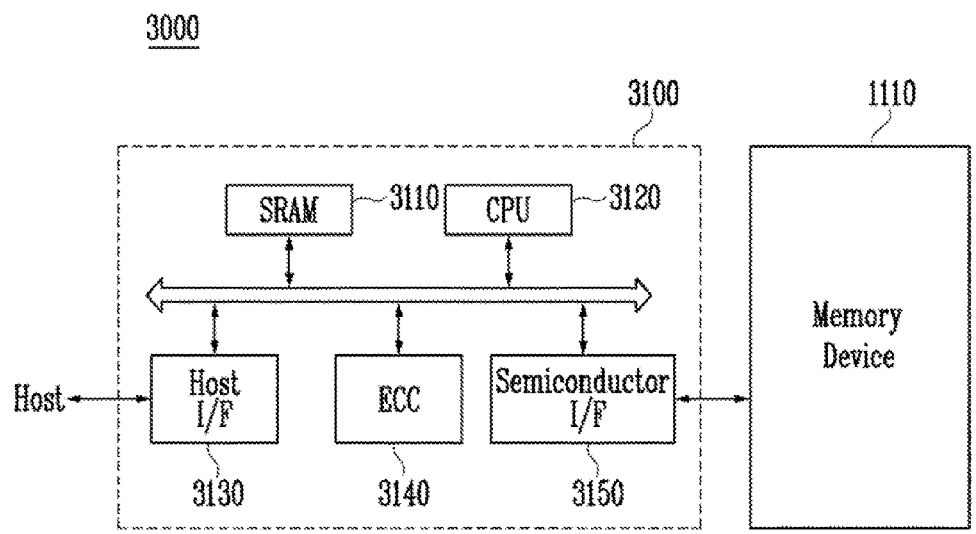
FIG. 11 is a block diagram for explaining a memory system including a memory device according to an embodiment of the present disclosure.

FIG. 11 is a block diagram illustrating a memory system including a memory device, according to an embodiment of the present disclosure. A memory device 1110 may have substantially the same configuration as that of FIG. 2; therefore, detailed description of the memory device 1110 will be omitted.

Referring to FIG. 11, the memory system 300 may include a control unit 3100 and the memory device 1110. The control unit 3100 may be configured to control the memory device 1110. An SRAM 3110 may be used, for example, as a working memory of a CPU 3120. A host interface (3130; Host I/F) may include a data exchange protocol of a host connected to the memory system 3000. An error correction circuit (ECC) 3140 provided in the control unit 3100 may detect and correct an error included in data read from the memory device 1110. A semiconductor interface (3150; Semiconductor I/F) may be configured to interface with the memory device 1110. The CPU 3120 may perform control operations for data exchange of the controller 3100. Although not illustrated in FIG. 11, the memory system 3000 may further include a ROM (not shown) for storing code data to interface with the host.

The memory system 3000 according to an embodiment may be applied to an electronic device, such as, for example, a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting/receiving information in an wireless environment, one of various devices for forming a home network, and the like.

Figure 12:
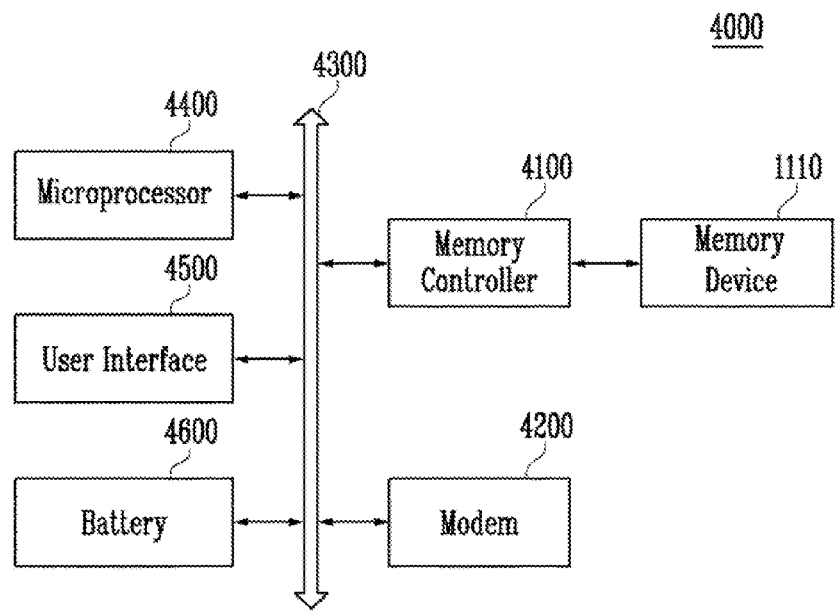
FIG. 12 illustrates a schematic diagram of a computing system including a memory device, according to an embodiment of the present disclosure.

FIG. 12 is a diagram illustrating a computing system including the memory device according to an embodiment of the present disclosure. In this embodiment, a memory device 1110 may have the substantially same configuration as that of FIG. 2; therefore, detailed description of the memory device 1110 will be omitted.

Referring to FIG. 12, a computing system 4000 may include memory device 1110, a control unit 4100, a modem 4200, a microprocessor 4400 and a user interface 4500 which are electrically coupled to a bus 4300. If the computing system 4000 according to the present embodiment is a mobile device, an additional battery 4600 may be provided to supply an operating voltage of the computing system 4000. Although not shown in the drawing, the computing system 4000 according to the present embodiment may further include an application chip set, a camera image processor (CIS), a mobile DRAM, or the like.

The control unit 4100 and the memory device 1110 may form a solid state drive/disk (SSD).

The system according to the present embodiment may be mounted using packages of various forms, including, for example, a Package on Package (PoP), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a System In Package (SIP), a Multi Chip Package (MCP), a Wafer-level Fabricated Package (WFP), a Wafer-Level Processed Stack Package (WSP), and the like.

The present disclosure may improve reliability of a program operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device comprising:
   a plurality of memory blocks each comprising a plurality of memory cells;

a peripheral circuit coupled to the memory cells through bit lines, and suitable for sensing currents of the bit lines varying according to threshold voltages of the memory cells; and a control logic suitable for controlling the peripheral circuit so that the current amount of the bit lines varies during a program operation of the memory cells, wherein the control logic controls the peripheral circuit such that a strobe time, at which the peripheral circuit starts sensing the currents of the bit lines, is adjusted.

2. The memory device according to claim 1, wherein the control logic controls the peripheral circuit such that the program operation is performed in an incremental step pulse program (ISPP) manner in which a plurality of program loops are performed with gradually increasing program voltages.

3. The memory device according to claim 2, wherein each of the program loops comprises:

increasing the threshold voltages of the memory cells to a target threshold voltage; and verifying the threshold voltages of the memory cells.

4. The memory device according to claim 3, wherein the control logic controls the peripheral circuit such that the strobe time is gradually shortened as a number of times of the program loops increases.

5. The memory device according to claim 3, wherein the control logic controls the peripheral circuit to perform:

verifying the threshold voltages with a first strobe time for a predetermined number of program loops from the first among the program loops; and verifying the threshold voltages with a second strobe time shorter than the first strobe time for program loops after the predetermined number of program loops.

6. The memory device according to claim 1, wherein the peripheral circuit comprises page buffers coupled to the bit lines.

7. The memory device according to claim 6, wherein each of the page buffers comprises:

a first switch suitable for coupling the bit lines and a first current sensing node to each other in response to a sensing signal;

a second switch suitable for coupling the first current sensing node and a sensing node in response to a transmission signal;

a third switch suitable for coupling a first node and the first current sensing node in response to a pre-charge transmission signal;

a fourth switch suitable for transmitting a power supply voltage to the first node in response to a voltage of a data node;

a fifth switch suitable for transmitting the power supply voltage applied to the first node to a second current sensing node in response to a pre-charge signal;

a sixth switch suitable for coupling the first current sensing node and the second current sensing node to each other in response to a sensing delivery signal;

a seventh switch suitable for coupling a second node and the data node to each other according to a voltage of the second current sensing node; and an eighth switch suitable for transmitting the power supply voltage to the second node in response to a strobe signal.

8. The memory device according to claim 7, wherein the control logic controls the page buffers such that the first, third, fourth, and fifth switches are turned on before the currents of the bit lines are sensed.

9. The memory device according to claim 8, wherein when the bit lines are pre-charged, the fifth switch is turned off such that the bit lines, the first current sensing node, and the second current sensing node are coupled to each other, and the first and sixth switches are turned on.

10. The memory device according to claim 9, wherein when the bit lines, the first current sensing node, and the second current sensing node are coupled to each other, the eighth switch is turned on after a set strobe time passes.

11. An operating method of a memory device, comprising:

increasing threshold voltages of selected memory cells;

pre-charging bit lines coupled to the selected memory cells; and sensing currents of the bit lines varying according to the threshold voltages of the memory cells after a strobe time upon completion of the pre-charging, wherein the increasing, the pre-charging and the sensing are repeated until the threshold voltages of the selected memory cells reach a target voltage while the strobe time is gradually decreased.

12. The operating method according to claim 11, wherein the increasing of the threshold voltages is performed by applying a program voltage to selected word lines coupled to the selected memory cells.

13. The operating method according to claim 11, wherein the sensing of the currents of the bit lines comprises:

applying a verify voltage to selected word lines coupled to the selected memory cells; and applying the verify voltage to the selected word lines such that currents of the bit lines coupled to the selected memory cells vary according to the threshold voltages.

14. An operating method of a memory device, comprising:

performing first to $N_{th}$ program loops each including sensing selected memory cells for a first strobe time; and performing, after the $N_{th}$ program loop, program loops each including sensing the memory cells for a second strobe time shorter than the first strobe time until threshold voltages of the selected memory cells reach a target voltage.

15. The operating method according to claim 14, wherein the first and second strobe times are times for sensing operations performed in verify operations comprised in the program loops.

* * * * *